(12) United States Patent
Barnes

(10) Patent No.: US 6,404,229 B1
(45) Date of Patent: Jun. 11, 2002

(54) COMPLEMENTARY LEVEL SHIFTING LOGIC CIRCUIT WITH IMPROVED SWITCHING TIME

(75) Inventor: William Bryan Barnes, Bradley Stoke (GB)

(73) Assignee: STMicroelectronics Limited, Almondsbury Bristol (GB)

(*) Notice: Subject to any disclaimer, the term of this patent is extended or adjusted under 35 U.S.C. 154(b) by 0 days.

(21) Appl. No.: 09/703,265

(22) Filed: Oct. 31, 2000

(30) Foreign Application Priority Data

Nov. 3, 1999 (GB) .............................. 9926070

(51) Int. Cl.$^7$ .................. H03K 19/094; H03K 19/0175
(52) U.S. Cl. ......................... 326/68; 326/119; 327/215
(58) Field of Search ............................. 326/68, 83, 85, 326/81, 112, 119, 121, 122; 327/215, 219, 55, 228

(56) References Cited

U.S. PATENT DOCUMENTS

| | | | |
|---|---|---|---|
| 4,616,148 A | 10/1986 | Ochii et al. ................. | 307/530 |
| 4,667,303 A | 5/1987 | Pfennings .................... | 364/784 |
| 5,378,932 A | 1/1995 | Shin et al. ................... | 327/333 |
| 5,399,928 A * | 3/1995 | Lin et al. ..................... | 327/434 |
| 5,510,731 A | 4/1996 | Dingwall ..................... | 326/63 |

FOREIGN PATENT DOCUMENTS

| | | | |
|---|---|---|---|
| EP | 0 529 545 | 3/1993 | ....... H03K/19/0185 |
| JP | 08046508 A | * 2/1996 | |

OTHER PUBLICATIONS

Sheridan, P. et al., An Expression for the Propagation Delay of a Differential Split–level (DSL) CMOS Logic Gate, IEEE Journal of Solid–State Circuits., vol. SC–22, No. 3, Jun. 1987, pp. 457–459, XP002126594.

* cited by examiner

Primary Examiner—Michael Tokar
Assistant Examiner—Daniel D. Chang
(74) Attorney, Agent, or Firm—Wolf, Greenfield & Sacks, P.C.; James H. Morris; Robert A. Skrivanek, Jr.

(57) ABSTRACT

A complementary logic circuit is provided which provides improved switching times over known complementary logic circuits. The circuit includes a further n-type transistor connected in series between a p-type and an n-type transistor. This additional n-type transistor has its gate permanently connected to an upper supply voltage, Vdd. When switching occurs the n-type transistor is effectively open circuit. This allows the first n-type transistor to switch on by a substantial amount quite quickly without 'fighting' the presently conducting p-type transistor. When the first n-type transistor has been turned substantially on second transistor becomes conductive. Then the p-type transistor is substantially turned off and no longer opposes the turning on of the first n-type transistor.

13 Claims, 4 Drawing Sheets

COMPLEMENTARY LEVEL SHIFTING LOGIC CIRCUIT WITH IMPROVED SWITCHING TIME

FIELD OF THE INVENTION

The present invention relates to a complementary logic circuit and more particularly but not exclusively to a level shifting circuit for converting a received input signal from a first voltage level to a second voltage level.

BACKGROUND TO THE INVENTION

In integrated circuits there often exists a need to convert a logic signal from a first voltage level to a second, higher voltage level. One such example where this need arises is when it is necessary to provide an output signal from an integrated circuit at a high voltage level to drive a peripheral circuit or output device. It is quite common for the peripheral circuits or output devices associated with the integrated circuit to operate at voltages measured in tens of volts, whereas the logic levels produced by the integrated circuit itself are commonly at approximately one and a half volts.

There are known circuits which have been provided for converting an input signal received from an integrated circuit at a low voltage level and producing at an output a signal having the same logic value as the input signal and at a substantially higher voltage. An example of one such circuit is shown in FIG. 1 and will now be discussed.

FIG. 1 shows a level shifting circuit having two circuit branches, a left hand circuit branch 1 and a right hand circuit branch 2. Each circuit branch comprises a NMOS field effect transistor (FET) 3,4 having a source connected to ground voltage. Each circuit branch further comprises a PMOS FET 5,6 having a source connected to an upper supply voltage Vdd. The upper supply voltage Vdd is at the second higher voltage level to which it is desired to convert input signals. The drains of the PMOS FETs 5,6 and the NMOS FETs 3,4 in each circuit branch 1,2 are connected together. The gate of the PMOS FET 5 in the left hand circuit branch 1 is connected to the drain of the NMOS FET 4 in the right hand circuit branch 2 and the gate of the PMOS FET 6 in the right hand circuit branch 2 is connected to the drain of the NMOS FET 3 in the left hand circuit branch 1. The output 8 of the circuit is also connected to the drain of the NMOS FET 4 of the right hand circuit branch. An input signal at the first voltage level is input to circuit at the input i/P. The input i/P is connected to the gate of the NMOS transistor 3 of the left hand circuit branch 1 and is connected to the input of an inverter 7, the output of the inverter 7 being connected to the gate of the NMOS transistor 4 of the right hand circuit branch 2.

The operation of the known circuit shown in FIG. 1 is as follows. Assume that the input signal is initially at a logic level high. Therefore the NMOS transistor 3 of the left hand circuit branch 1 is conductive and the NMOS transistor 4 of the right hand circuit branch 2 is non-conductive. The drain 9 of the NMOS transistor 3 of the left hand circuit branch 1 is therefore held at ground voltage which in turn provides a gate signal to the PMOS transistor 6 of the right hand circuit branch 2 so that this PMOS transistor 6 is conductive. As the PMOS transistor 6 of the right hand circuit branch 2 is conductive, the drain 10 of the NMOS transistor 4 of the right hand circuit branch 2 is held at Vdd volts and a high gate signal is applied to the PMOS transistor 5 of the left hand circuit branch 1, rendering the other PMOS transistor 5 non-conductive. Hence the output o/p is a logic level high, at a higher voltage level supplied by Vdd.

Assume now that the input signal at the input i/p changes to a logic level zero. The NMOS transistor 3 of the left hand circuit branch is now non-conductive while the other NMOS transistor 4 starts to switch to the conductive state. However, for this NMOS transistor 4 to fully turn on, the voltage at the drain 10 of the NMOS transistor 4 of the right hand circuit branch 2 must be pulled down to ground voltage against the action of the PMOS transistor 6 of the right hand circuit branch 2 which is still conductive, and therefore is attempting to maintain this voltage at Vdd volts. When this voltage has fallen by a voltage level equivalent to the threshold voltage of the PMOS transistor 5 of the left hand circuit branch, the PMOS transistor 5 will begin to switch to the conductive state. At this point the voltage at the drain 9 of the NMOS transistor 3 of the left hand circuit branch begins to rise towards Vdd due to the action of the increasing conductivity of the PMOS transistor 5 of the left hand circuit branch 1. This in turn begins to switch the other PMOS transistor 6 into the non-conducting state. As the PMOS transistor 6 of the right hand circuit branch turns off, the NMOS transistor 4 of the right hand circuit branch is able to pull the voltage at its drain 10 fully to ground voltage. Hence the PMOS transistor 5 of the left hand circuit branch is switched fully on, the drain 9 of the NMOS transistor of the left hand circuit branch is pulled up fully to a voltage level Vdd and the other PMOS transistor 6 of the right hand circuit branch is turned fully off.

For the circuit shown in FIG. 1 to work both NMOS transistors 3,4 must be capable of "over powering" the respective PMOS transistors 5,6. It will be appreciated that this requires the drain/source saturation current of the PMOS transistors (referred to as Idd_PMOS) for a drain/source voltage Vds and gate/source voltage Vgs equal to a supply voltage at the second, high voltage level, Vdd_high, must be less than the drain/source current of the NMOS transistors, Idd_NMOS, for a drain/source voltage Vds equal to the supply voltage Vdd_high and a gate/source voltage Vgs equal to a supply voltage at the first, low voltage level, Vdd_low. This can be expressed as Idd_PMOS (Vds=Vgs=Vdd_High)<Idd_NMOS (Vgs=Vdd_Low, Vds=Vdd_High) for all constitutions of the circuit including strong_PMOS/weak_NMOS. This requires the PMOS field effect transistors to be substantially smaller than the NMOS transistors and subsequently the rise time of the PMOS transistors is large. The large rise time reduces the switching speed of the level shifting circuit, thus limiting the speed at which an integrated circuit which includes such a level shifting circuit can operate.

It will be appreciated that if the input signal to the NMOS transistor 3 of the left hand circuit branch is inverted rather than the input to the NMOS transistor 4 of the right hand circuit branch then the output of the circuit will be the inverse of the input signal i.e. the circuit will operate as a logic invertor, as well as a level shifter.

It will be further appreciated that the circuit shown in FIG. 1 has a resultant current flow when the input signal input to the circuit at the input i/P changes from a first logic state to a second logic state. That is to say the circuit only consumes power during switching. Therefore, in the circuit shown in FIG. 1, the relatively slow switching speed of the circuit increases the time period during which there is a resultant current flow in the circuit and hence increases the power consumption of the circuit.

It is an aim of embodiments of the present invention to provide a complementary logic circuit which mitigates against the disadvantages of known level shifting circuits.

SUMMARY OF THE INVENTION

According to the present invention there is provided a complementary logic circuit having an input, an output and comprising first and second circuit branches, each circuit branch having: a first transistor of a first conductivity type having a first terminal connected to a first supply node, a control terminal and a second terminal; a second transistor of the first conductivity type having a first terminal connected to the second terminal of the first transistor, a control terminal connected to a second supply node, and a second terminal; and a third transistor of a second conductivity type different to said first conductivity type, having a first terminal connected to the second terminal of the second transistor, a control terminal, and a second terminal connected to the second supply node, wherein: the control terminals of said first transistors of respective first and second circuit branches are coupled to said input; said output is connected to one of the first and second terminals of or of said third transistors, and the control terminals of said third transistors of said first and second circuit branch are connected to the second terminals of said first transistors of said second and first circuit branch respectively.

To provide a better understanding of the present invention a preferred embodiment will now be described in further detail by way of example with reference to the following Figures, in which;

BRIEF DESCRIPTION OF THE DRAWINGS

Unless stated otherwise, like reference numerals indicate like parts.

DESCRIPTION OF A PREFERRED EMBODIMENT OF THE INVENTION

Figure 1:
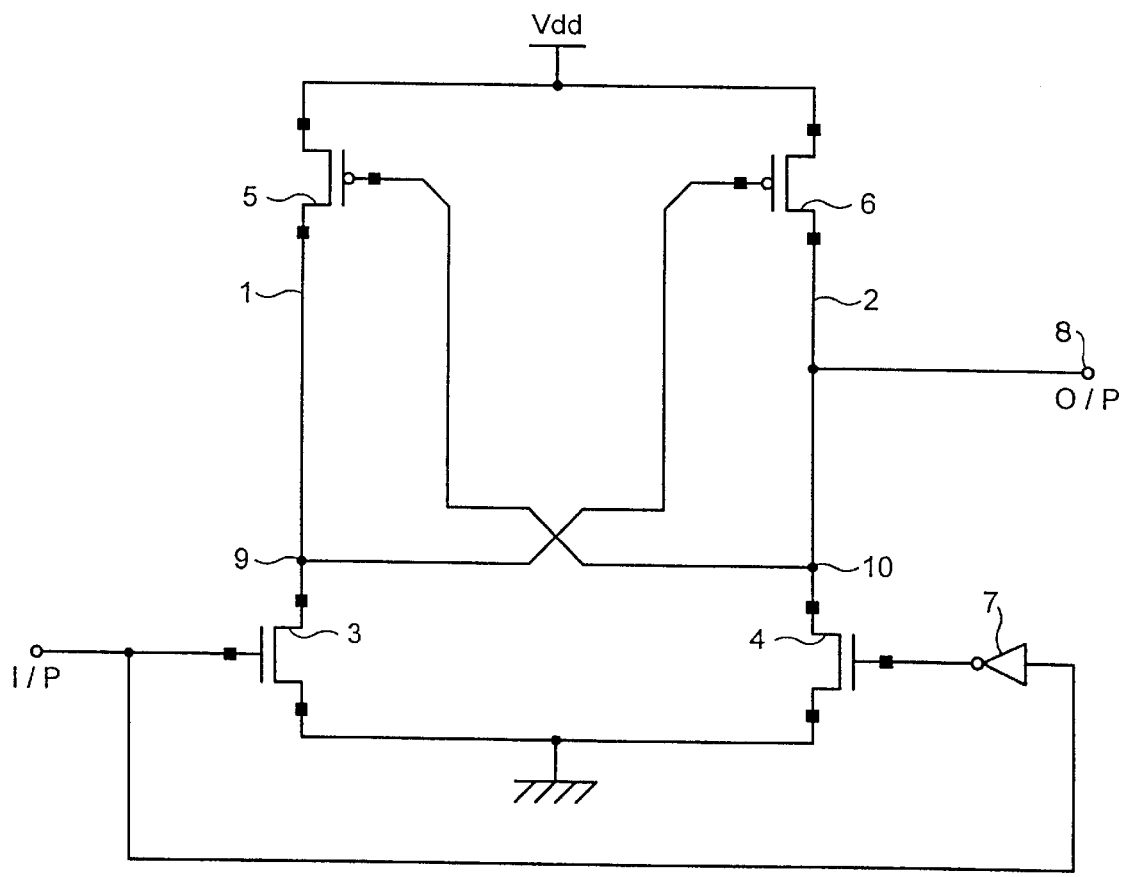
FIG. 1 shows a circuit diagram of a known level shifting circuit.
Figure 2:
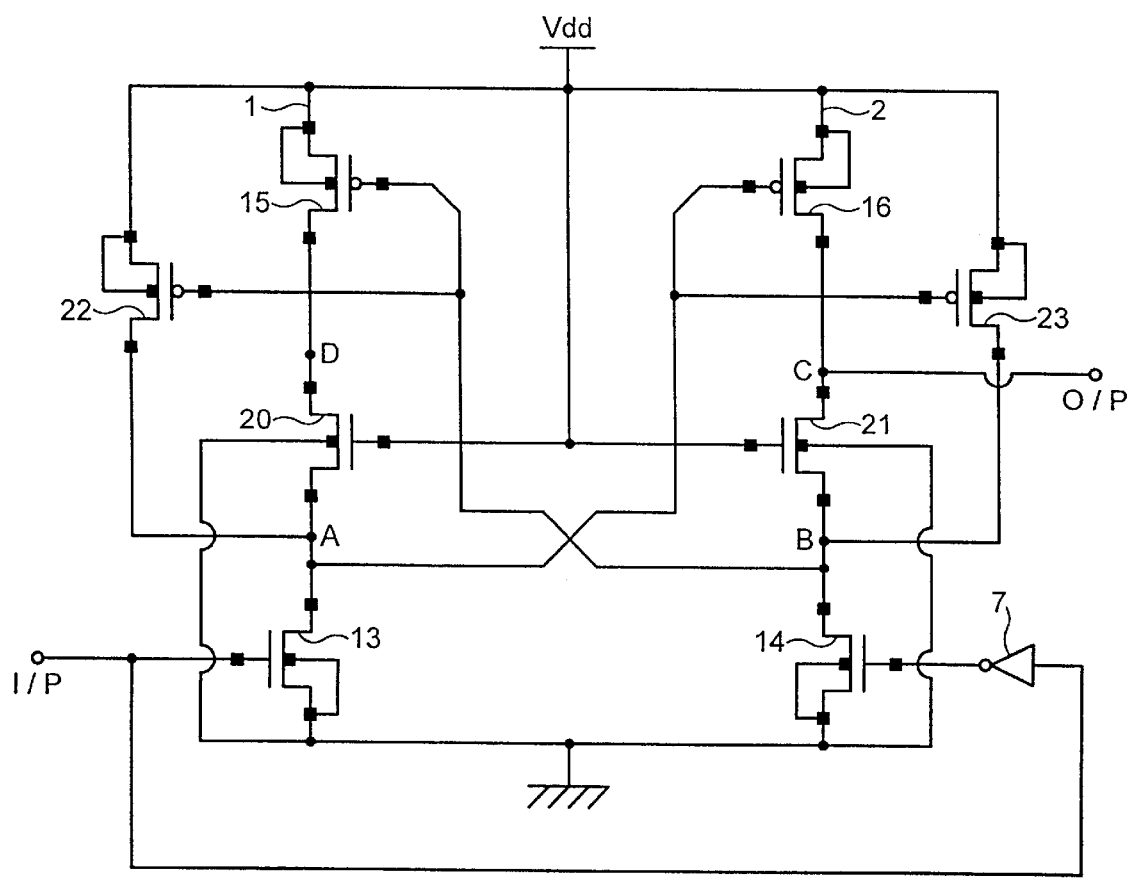
FIG. 2 shows a circuit diagram of a complementary logic circuit according to a preferred embodiment of the present invention.

FIG. 2 shows a circuit diagram of a logic circuit according to a preferred embodiment of the present invention. As shown in FIG. 1, the circuit of FIG. 2 comprises two circuit branches, a left hand circuit branch 1 and a right hand circuit branch 2, with each circuit branch comprising a first NMOS transistor 13, 14 and a first PMOS transistor 15,16. However, in comparison to the circuit shown in FIG. 1, each circuit branch of the circuit of FIG. 2 comprises a second NMOS transistor 20,21 connected between the first NMOS transistor 13,14 and the PMOS transistor 15,16 of each circuit branch 1,2. The sources of the second NMOS transistors 20,21 are connected to the drains of the first NMOS transistors 13,14 in respective current branches while the gates of the second NMOS transistors 20,21 are connected to the upper supply voltage Vdd.

Each circuit branch further comprises a second PMOS transistor 22,23. The source of each second PMOS transistor 22, 23 is connected to the upper supply voltage Vdd and their drains are connected to the source connection of the respective second NMOS transistors 20,21. These connections will be referred to hereinafter as node A and node B. The gates of the second PMOS transistors 22,23 are connected to the gates of respective first PMOS transistors 15,16. The output of the circuit o/p is connected to the circuit node which is located at the drain to drain connection of the first PMOS transistor 16 of the right hand circuit branch and the corresponding second NMOS transistor 21. This circuit node will be referred to hereinafter as node C.

The first and second NMOS transistors (13,14,20,21) are arranged to be weak transistors, as are the second PMOS transistors 22,23. The first PMOS transistors 15,16 are, on the other hand, strong transistors in comparison to the other transistors. It is to be understood that references to a strong transistor in this application refer to a transistor having a relatively high value of Idd with respect to other transistors in the circuit which have a lower value of Idd and are referred to as weak transistors.

The operation of the circuit shown in FIG. 2 will now be described. Assume that the input signal at the input i/P is at a logic level high. The first NMOS transistors 13,14 will be turned on and off respectively. Hence node A will be pulled to ground through transistor 13 of the left hand circuit branch. The second NMOS transistor 20 of the left hand circuit branch will be switched on and thus the circuit node at the drain to drain connection of that second NMOS transistor 20 and the corresponding first PMOS transistor 15 will also be pulled down to a voltage level approximately equal to ground. This circuit node will be referred to hereinafter as node D. As node A is at substantially ground voltage, so is the gate voltage on the first and second PMOS transistors 16, 23 of the right hand circuit branch and thus these two transistors are conductive. Hence node C and thus the output o/p are pulled up to the upper voltage supply level Vdd by the first PMOS transistor of the right hand circuit branch 16 and node B is similarly pulled up to vdd by the second PMOS transistor 23 of the right hand circuit branch. Consequently, the first and second PMOS transistors 15,22 of the left hand circuit branch are off. As node B is at substantially the same voltage level as the voltage level at the gate of the second NMOS transistor 21 of the right hand circuit branch, that is Vdd, the gate/source voltage, Vgs does not exceed the threshold voltage for this transistor and it is therefore non-conducting.

Assuming now that the input voltage at the input i/P switches from a logic level high to a logic level low. The first NMOS transistor 13 of the left hand circuit branch switches off while the corresponding NMOS transistor 14 of the right hand circuit branch is switched on. Node B now starts to fall as it is pulled down by the action of the first NMOS transistor 14 of the right hand circuit branch. As previously explained the second NMOS transistor 21 of the right hand circuit branch is initially off and thus for the first NMOS transistor 14 of the right hand circuit branch to pull node B towards ground, it must only act against the still conducting second PMOS transistor 23 of the right hand circuit branch, rather than against the first PMOS transistor 16 of right hand circuit branch. The second PMOS transistor of this circuit branch is arranged to be a weak transistor and together with the fact that the second NMOS transistor 21 of the right circuit branch is effectively open circuit at this point, the first NMOS transistor 14 of the right circuit branch is able to pull down node B to a voltage level Vdd minus Vth (Vth being the threshold voltage of the second NMOS transistor 21) in a relatively short time period. The drop in voltage of node B to Vdd minus Vth is mirrored at the gate of the first PMOS transistor 15 of the left hand circuit branch and is of a sufficient magnitude to turn on this PMOS transistor 15 by a substantial amount, as well as the second PMOS transistor 22 of the left hand circuit branch. Node D now starts to rise in voltage due to the action of the first PMOS transistor 15 of the left hand circuit branch while node A also starts to rise by virtue of the action of the second PMOS transistor 22 of the left hand circuit branch. At this point the second NMOS transistor 20 of the left hand circuit branch is conductive and so node A is also pulled up together with node D by the first PMOS transistor 15 of the left hand circuit branch. Subsequently, this rise in voltage of node A is mirrored on the gates of the first and second PMOS transistors 16,23 of the right hand circuit branch which are hence rendered substantially non-conductive. The first PMOS transistor 16 is arranged to be a "strong" transistor and is thus not subject to a large rise time.

Concurrently when node B reaches a voltage level Vdd minus Vth, the voltage Vgs of the second NMOS transistor 21 of the right hand circuit branch is sufficient to turn this transistor on. However, the first PMOS transistor 16 of the right hand circuit branch has now been turned substantially off and so node B and node C can be pulled down by the first NMOS transistor 14 of the right hand circuit branch without competition from the corresponding PMOS transistor 16. As node B is pulled fully to ground the first and second PMOS transistors 15,22 of the left hand circuit branch are turned fully on. This allows the second PMOS transistor 22 of left hand circuit branch to fully pull up node A to the upper supply voltage Vdd and thus fully turn off the first and second PMOS transistors 16,23 of the right hand circuit branch.

An advantage of the logic circuit as shown in FIG. 2 is that as the first NMOS transistors 13, 14 of each circuit branch do not have to overpower the first PMOS transistors 15,16 of respective circuit branches, the first PMOS transistors 15,16 may be arranged to be "strong" transistors, that is relatively large, with the result that their respective rise times, and thus the overall switching time of the circuit, is greatly reduced in comparison with the known circuit of FIG. 1.

A further advantage of embodiments of the present invention over the level shifting circuit of FIG. 1 will now be described. In CMOS circuits the performance of the circuit is often reduced due to an effect known as the "body effect". Further reference to FIG. 2 shows that the substrates of the second NMOS transistors 20,21 are connected to the ground voltage, whereas the sources of those transistors are connectable to ground only via the main current path of the respective first NMOS transistors 13, 14. The result is that the substrate connection acts as a back gate to the second NMOS transistors, which back gate is negative relative the source. The effect, known as "body effect" is to require application of a higher front gate potential to turn the relevant transistor on, in other words to raise the transistor threshold voltage Vgs. Hence for a constant gate potential, here equal to Vdd, the source potential is lower.

The consequence of this is that the PMOS transistors will be easier to turn on, as their gates are directly cross-coupled to the corresponding sources of the relevant second NMOS transistor 20,21. This compensates for increased Idd__ PMOS. Hence the "body effect" is used to the advantage of embodiments of the present invention.

In an alternative embodiment of the present invention the circuit as shown in FIG. 2 may be provided with the omission of the second PMOS transistors 22,23 of each circuit branch. Consider now such a circuit during the transition of the input from a low logic level to a high logic level, as previously described. The operation of the circuit would be initially the same as described hereinbefore up to the point that node A rises to a voltage level of Vdd minus Vth (Vth also being the threshold voltage of the second NMOS transistor 20 of the left hand circuit branch) then the second NMOS transistor 21 of the left hand circuit branch will turn off as the voltage between the gate and source, Vgs will no longer be sufficient to bias the transistor. At this point node A is isolated between the first and second NMOS transistors 13,20 of the left hand circuit branch, which are both in a non-conductive state and thus node A cannot be pulled completely to the upper supply voltage Vdd. Hence as the voltage at node A is mirrored at the gate of the first PMOS transistor 16 of the right hand circuit branch, this transistor will not be fully turned off and thus there will be a small static leakage current through this PMOS transistor.

Hence, although this alternative embodiment of the present invention achieves some of the stated aims of embodiments of the present invention by providing a complementary logic circuit with a reduced switching time, the preferred embodiment shown in FIG. 2 which includes a second PMOS transistor 22,23 in each circuit branch is even more advantageous as any static leakage currents through the first PMOS transistors 15,16 are avoided.

It will be appreciated that this circuit would perform in an analogous manner if the conductivity types of the respective transistors were reversed, if all the NMOS transistors were replaced with PMOS transistors and all of the PMOS transistors were replaced with NMOS transistors, together with the polarity of the supply voltages.

It will also be appreciates that the output of the circuit shown in FIG. 2 may alternatively be connected to node D, in which case the output would be the complement of the input value. In this case the circuit would operate as an invertor. Alternatively, the output from the circuit shown in FIG. 2 may be connected to either node A or node B which would reduce the time taken for the output o/p to fall from the upper supply voltage Vdd to substantially ground i.e. when the o/p changes from a logical high to a logical low. Conversely the time taken for the output o/p to rise to the upper supply voltage Vdd would increase.

Where both true and complementary outputs from the circuit of FIG. 2 are required then this is easily achieved by connecting outputs to either nodes A and B, or nodes C and D, without the need for any additional circuitry. This feature of the circuit of FIG. 2 has the property that when the output changes from one voltage level to the other, one of the complementary outputs falls to the lower voltage level before the other output rises.

Figure 3A:
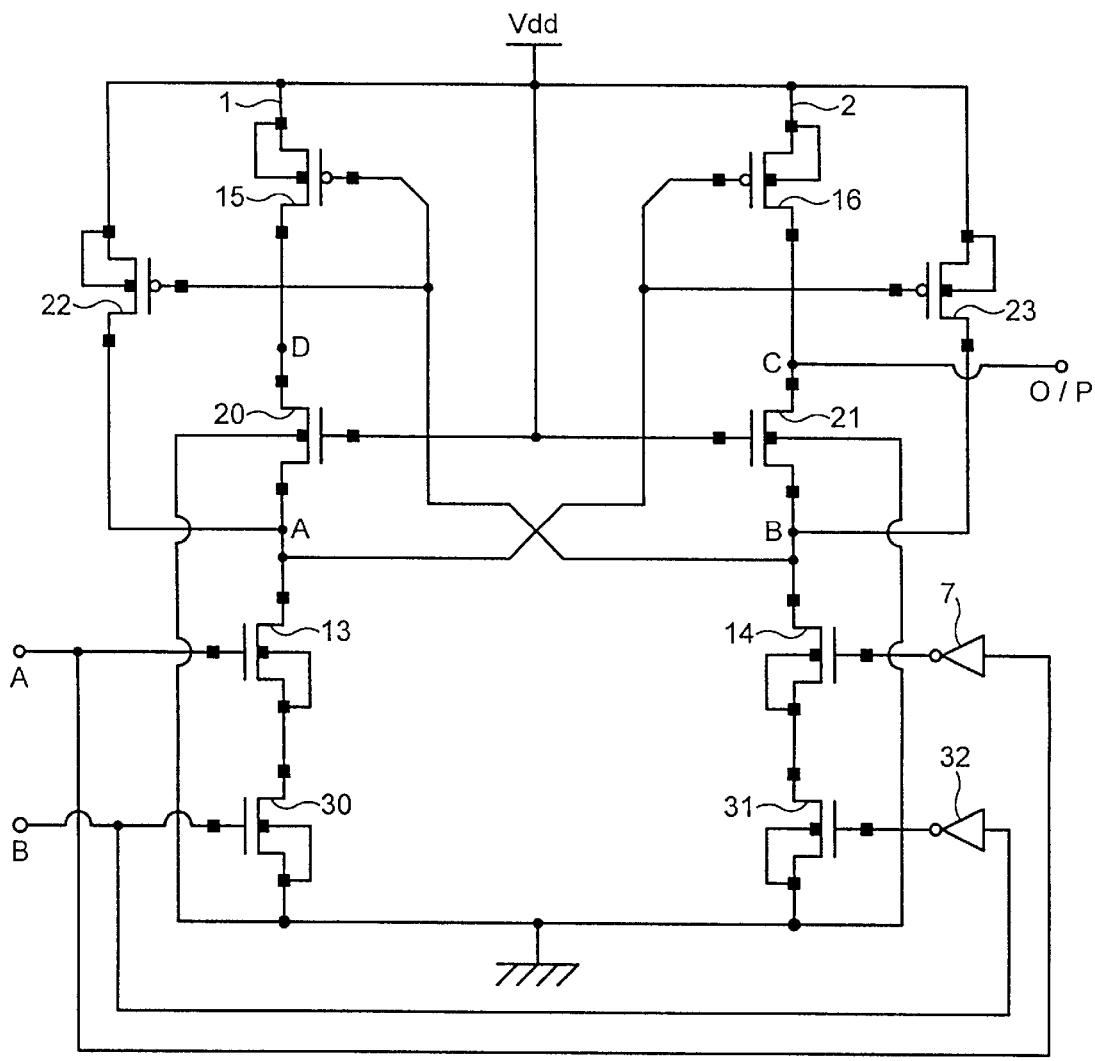
FIG. 3A shows an AND gate logic circuit in accordance with an embodiment of the present invention.
Figure 3B:
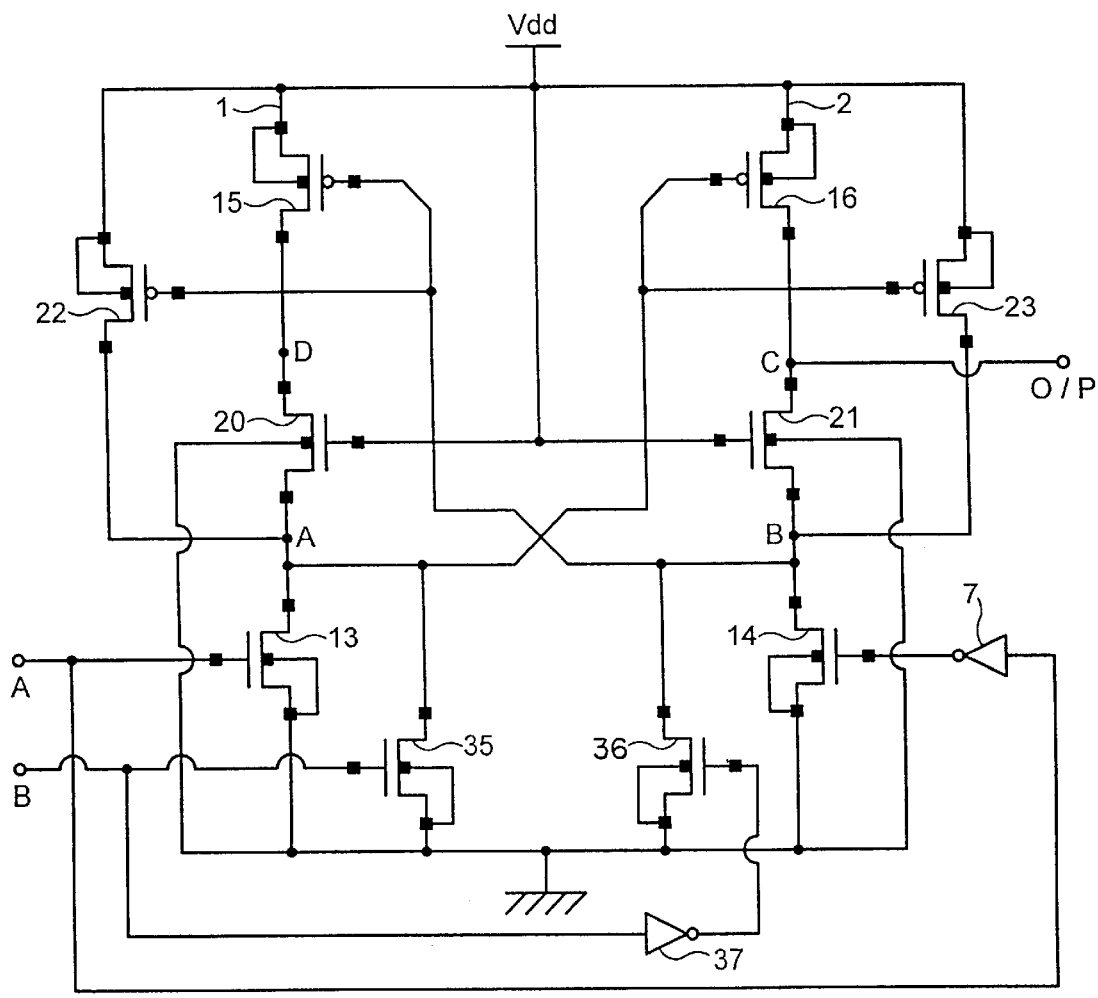
FIG. 3B shows an OR gate logic circuit in accordance with an embodiment of the present invention.

It will be appreciated by those skilled in the art that the principle of operation of the logic circuit shown in FIG. 2 is equally applicable to other logic circuits. For example FIG. 3A shows an AND gate logic circuit. The circuit is very similar to that shown in FIG. 2 except that a further NMOS transistor has been added in series with the first NMOS transistor 13, 14 of each circuit branch. A first input A is applied to the first NMOS transistors as in FIG. 2 but a further input B is applied to the control gates of the further transistors 30,31. The output of an additional invertor 32 is connected to the gate of the further transistor in the right hand circuit branch. A further example is shown in FIG. 3B. Further NMOS transistors 35, 36 have been connected in parallel with the first NMOS transistors 13, 14 of the left and right hand circuit branches. The control gates of the further transistors 35, 36 are connected to a second input B, the control gate of the further transistor 36 in the right hand circuit branch being connected via an additional invertor 37. This circuit operates as an OR logic circuit.

It will also be appreciated that the second NMOS transistor 20,21 of each circuit branch may be replaced with any suitable voltage dropping circuit element, for instance an element which conducts only when a sufficiently high voltage is applied to it.

Another application of this technique as discussed with reference to the circuit of FIG. 2 is to complementary n-pass logic circuitry.

What is claimed is:

1. A complementary logic circuit having an input, an output and comprising first and second circuit branches, each circuit branch comprising:
   a first transistor of a first conductivity type having a first terminal connected to a first supply node, a control terminal and a second terminal;
   a second transistor of the first conductivity type having a first terminal connected to the second terminal of the first transistor, a control terminal connected to a second supply node, and a second terminal; and
   a third transistor of a second conductivity type different to said first conductivity type, having a first terminal connected to the second terminal of the second transistor, a control terminal, and a second terminal connected to the second supply node, wherein:
   the control terminals of said first transistors of respective first and second circuit branches are coupled to said input;
   said output is connected to one of the first and second terminals of one of said second transistors;
   the control terminals of said third transistors of said first and second circuit branch are connected to the second terminals of said first transistors of said second and first circuit branch respectively; and
   said first, second, and third transistors are FETS and said first and second transistors of each circuit branch have substantially the same drain to source saturation current and said third transistors have a higher drain to source saturation current than said first and second transistors.

2. A circuit according to claim 1, wherein said transistors of the first conductivity type are n-type transistors and said transistors of the second conductivity type are p-type transistors.

3. A circuit according to claim 1, wherein the circuit operates as an inverter.

4. A circuit according to claim 1, wherein the circuit performs and AND logic function.

5. A circuit according to claim 1, wherein the circuit performs an OR logic function.

6. A circuit according to claim 1, wherein each circuit branch further comprises a fourth transistor of said second conductivity type having a first terminal connected to said second supply node, a second terminal connected to the second terminal of the first transistor of the respective circuit branch and a control terminal connected to the control terminal of the third transistor of the respective circuit branch.

7. A complementary logic circuit having an input, an output and comprising first and second circuit branches, each circuit branch comprising:
   a first transistor of a first conductivity type having a first terminal connected to a first supply node, a control terminal and a second terminal;
   a second transistor of the first conductivity type having a first terminal connected to the second terminal of the first transistor, a control terminal connected to a second supply node, and a second terminal; and
   a third transistor of a second conductivity type different to said first conductivity type, having a first terminal connected to the second terminal of the second transistor, a control terminal, and a second terminal connected to the second supply node, wherein:
   the control terminals of said first transistors of respective first and second circuit branches are coupled to said input;
   said output is connected to one of the first and second terminals of one of said second transistors;
   the control terminals of said third transistors of said first and second circuit branch are connected to the second terminals of said first transistors of said second and first circuit branch respectively; and
   each circuit branch further comprises a fourth transistor of said second conductivity type having a first terminal connected to said second supply node, a second terminal connected to the second terminal of the first transistor of the respective circuit branch and a control terminal connected to the control terminal of the third transistor of the respective circuit branch.

8. A circuit according to claim 7, wherein said fourth transistors have a lower drain to source saturation current than said third transistors.

9. A circuit according to claim 7, wherein substantially no static leakage current is present.

10. A circuit according to claim 7, wherein said transistors are Field Effect Transistors.

11. A circuit according to claim 7, wherein the circuit operates as an inverter.

12. A circuit according to claim 7, wherein the circuit performs an AND logic function.

13. A circuit according to claim 7, wherein the circuit performs an OR logic function.

* * * * *